(12) United States Patent
Kim et al.

(10) Patent No.: US 8,670,857 B2
(45) Date of Patent: Mar. 11, 2014

(54) FLEXIBLE PROCESS CONDITION MONITORING

(75) Inventors: Hong Soon Kim, San Jose, CA (US); James Hoffman, San Jose, CA (US); Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 465 days.

(21) Appl. No.: 13/019,838

(22) Filed: Feb. 2, 2011

(65) Prior Publication Data

US 2011/0190921 A1  Aug. 4, 2011

Related U.S. Application Data

(60) Provisional application No. 61/300,558, filed on Feb. 2, 2010.

(51) Int. Cl.
*G06F 19/00* (2011.01)
(52) U.S. Cl.
USPC .......................................... 700/110; 700/121
(58) Field of Classification Search
USPC .......... 700/98, 121, 101; 438/104, 141, 31, 5; 424/464
See application file for complete search history.

(56) References Cited

U.S. PATENT DOCUMENTS

| | | | | |
|---|---|---|---|---|
| 5,068,124 | A | * | 11/1991 | Batey et al. ................... 427/579 |
| 5,643,364 | A | * | 7/1997 | Zhao et al. ................ 118/723 E |
| 5,647,953 | A | * | 7/1997 | Williams et al. ............... 134/1.1 |
| 5,875,416 | A | * | 2/1999 | Kanno .......................... 702/130 |
| 6,275,740 | B1 | * | 8/2001 | Smith et al. ................... 700/108 |
| 6,566,016 | B1 | * | 5/2003 | Ziger .................................. 430/5 |
| 6,718,272 | B1 | * | 4/2004 | Fisk et al. ....................... 702/58 |
| 6,910,947 | B2 | | 6/2005 | Paik |
| 6,913,938 | B2 | * | 7/2005 | Shanmugasundram et al. ............................... 438/16 |
| 6,956,651 | B2 | | 10/2005 | Lackritz et al. |
| 6,961,626 | B1 | | 11/2005 | Paik |
| 6,984,198 | B2 | | 1/2006 | Krishnamurthy et al. |
| 6,999,836 | B2 | | 2/2006 | Schwarm et al. |
| 7,040,956 | B2 | | 5/2006 | Paik |
| 7,069,101 | B1 | | 6/2006 | Arackaparambil et al. |
| 7,082,345 | B2 | | 7/2006 | Shanmugasundram et al. |
| 7,096,085 | B2 | | 8/2006 | Paik |
| 7,101,799 | B2 | | 9/2006 | Paik |
| 7,158,221 | B2 | | 1/2007 | Davis et al. |
| 7,160,739 | B2 | | 1/2007 | Shanmugasundram et al. |
| 7,174,230 | B2 | | 2/2007 | Arackaparambil et al. |
| 7,188,142 | B2 | | 3/2007 | Chi et al. |
| 7,201,936 | B2 | * | 4/2007 | Schwarm et al. ................. 427/8 |
| 7,205,228 | B2 | | 4/2007 | Padhi et al. |
| 7,221,990 | B2 | | 5/2007 | Paik |
| 7,225,047 | B2 | | 5/2007 | Al-Bayati et al. |
| 7,272,459 | B2 | | 9/2007 | Kokotov et al. |

(Continued)

*Primary Examiner* — Kidest Bahta
(74) *Attorney, Agent, or Firm* — Patterson & Sheridan, LLP

(57) ABSTRACT

The present invention generally relates to a method for flexible process condition monitoring. In a process that utilizes RF power, the RF power may be applied at different levels during different points in the process. Software may be programmed to facilitate the monitoring of the different points in the process so that the acceptable deviation range of the RF power for each point in the process may be set to different values. For example, one phase of the process may permit a greater range of RF power deviation while a second phase may be much more particular and permit very little deviation. By programming software to permit each phase of the process to be uniquely monitored, a more precise RF process may be obtained.

13 Claims, 1 Drawing Sheet

(56) References Cited

U.S. PATENT DOCUMENTS

| | | |
|---|---|---|
| 7,330,244 B2 | 2/2008 | Davis et al. |
| 7,333,871 B2 | 2/2008 | Schwarm |
| 7,337,019 B2 | 2/2008 | Reiss et al. |
| 7,349,753 B2 | 3/2008 | Paik |
| 7,354,332 B2 | 4/2008 | Surana et al. |
| 7,356,377 B2 | 4/2008 | Schwarm |
| 7,602,484 B2 | 10/2009 | Davis et al. |
| 7,698,012 B2 | 4/2010 | Shanmugasundram et al. |
| 2003/0049376 A1* | 3/2003 | Schwarm et al. ........ 427/255.28 |

* cited by examiner

FLEXIBLE PROCESS CONDITION MONITORING

CROSS-REFERENCE TO RELATED APPLICATIONS

This application claims benefit of U.S. Provisional Patent Application Ser. No. 61/300,558 (APPM/14756L), filed Feb. 2, 2010, which is herein incorporated by reference.

BACKGROUND OF THE INVENTION

1. Field of the Invention

Embodiments of the present invention generally relate to a method for flexible process condition monitoring.

2. Description of the Related Art

In a process that involves several processing steps, such as a plasma enhanced chemical vapor deposition (PECVD) process whereby RF power is delivered to an electrode in multiple steps at different levels, monitoring the processing conditions may be difficult. Since the process recipe is composed of several sub steps, which each may have different process conditions, process monitoring results show a typical characteristic in each step for each item. However, the allowable deviation ranges are set as an equipment cluster, which is considered as a universal parameter to cover all process conditions. A universal processing condition is not enough to detect a small deviation in a specific step.

As shown in FIG. 1, a process recipe is charted showing six steps. For each of the steps, an acceptable deviation range (an area that defines the acceptable deviation for the RF power level) is defined. The acceptable deviation range for each step is programmed to be substantially identical without any regard to the sensitivity of each step. Thus, while the deviation from the expected value is shown to be within the acceptable deviation range for each step, the deviation from the expected value for the third step may be outside the tolerable limits of the process, yet not detected.

One manner to deal with the problem of FIG. 1 is to simply shrink the acceptable deviation range to the value of the most sensitive process step. In FIG. 1, the third step is the most sensitive process step. Thus, the value of the permissible deviation may be set based upon the third step. In so doing, the process may be overly sensitive and thus, less efficient. The enhanced sensitivity of the process may cause the RF power level to be indicated as outside the acceptable deviation range for a step, even though the indicated RF power level may not have any negative impact upon the process. Such a situation would have a negative impact on substrate throughput.

Therefore, there is a need in the art for a method of flexibly monitoring the conditions of a recipe that has multiple steps with different conditions.

SUMMARY OF THE INVENTION

The present invention generally relates to a method for flexible process condition monitoring. A process parameter in a process sequence, such as substrate temperature or RF frequency, has an expected value. In operation, deviations from the expected value may sometimes occur. These deviations are planned for in advance so that an acceptable deviation range is established. Outside of the acceptable deviation range, the process should not proceed. A "no alarm" range should be selected that is within the acceptable range. The "no alarm" range is an acceptable deviation from the expected value. When the value of the process parameter is within the "no alarm" range, the technician is not alerted. An "alarm" range should also be selected that is outside of the "no alarm" range, yet stretches to the boundaries of the acceptable deviation range. The "alarm" range is still an acceptable deviation from the expected value, but is sufficiently close to the boundaries of the acceptable deviation range that the technician needs to be made aware of the situation. Therefore, when the value of the process parameter is within the "alarm" range, the technician is alerted. The values for the "alarm" range and the "no alarm" are process specific. Thus, two separate PECVD processes may have different "alarm" and "no alarm" ranges as well as different acceptable deviation ranges.

In one embodiment, a computer implemented method for monitoring the fluxuation level of RF power applied to an electrode is disclosed. The computer implemented method includes selecting a first acceptable deviation range of parameters for a first processing step and selecting a second acceptable deviation range of parameters for a second processing step separate from the first processing step. The second acceptable deviation range is different than the first acceptable deviation range. The computer implemented method may also include receiving into a processor a first set of data indicative of the actual value of the process parameter from the first processing step and receiving into the processor a second set of data indicative of the actual value of the process parameter from the second processing step. The method may also include analyzing the first data set and the second data set with the processor to determine whether the first data set and/or the second data set are outside the respective first acceptable range of parameters or the second acceptable range of parameters. Additionally, the method may also include indicating the first set of data and/or the second set of data are outside the corresponding first acceptable deviation range or the second acceptable deviation range.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
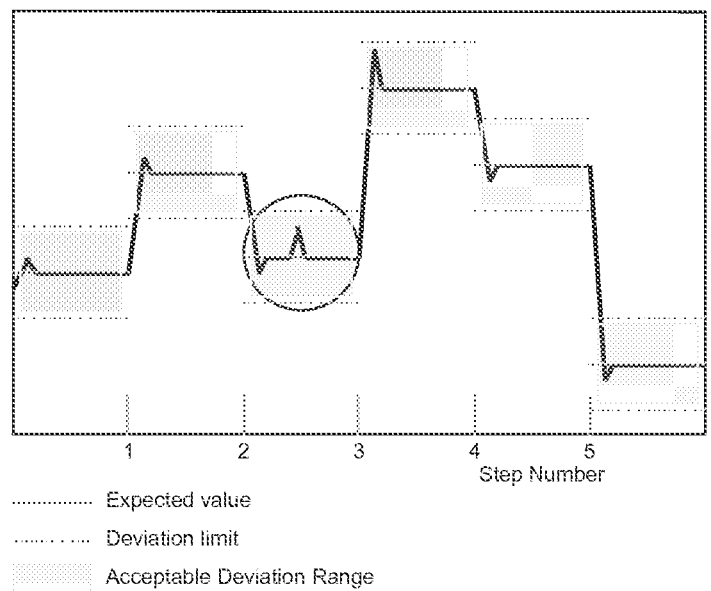
FIG. 1 is a prior art graph showing a process recipe whereby the deviation from the expected value is undetected because the acceptable deviation range encompasses the deviation.

The present invention generally relates to a method for flexible process condition monitoring. There are many process parameters that may be monitored during a process. Parameters that may be monitored include substrate temperature, susceptor temperature, showerhead temperature, target temperature, RF frequency, RF forward power from the power source, reflected RF power back to the power source, gas flow rate, spacing between substrate and electrode, etc. It is to be understood that while the discussion herein will refer to RF power applied or forward RF power, the flexible process condition monitoring is applicable to other process parameters as well. Additionally, multiple processing parameters may be monitored.

In a process that utilizes RF power, for example, the RF power may be applied at different levels during different points in the process. Software may be programmed to facilitate the monitoring of the different points in the process so that the acceptable deviation range of the RF power for each point in the process may be set to different values. For example, one phase of the process may permit a greater range of RF power deviation while a second phase may be much more particular and permit very little deviation. By programming software to permit each phase of the process to be uniquely monitored, a more precise process may be obtained.

In order to uniquely monitor each phase, each phase will have a unique expected value and unique acceptable deviation range. Outside of the acceptable deviation range, the process should not proceed. A "no alarm" range should be selected that is within the acceptable deviation range. The "no alarm" range is an acceptable deviation from the expected value. When the value of the process parameter is within the "no alarm" range, the technician is not alerted. An "alarm" range should also be selected that is outside of the "no alarm" range, yet stretches to the boundaries of the acceptable deviation range. The "alarm" range is still an acceptable deviation from the expected value, but is sufficiently close to the boundaries of the acceptable deviation range that the technician needs to be made aware of the situation. Therefore, when the value of the process parameter is within the "alarm range", the technician is alerted. The unique monitoring is applicable to all conceivable process variables for a process.

The software operates by storing the "no alarm" range of the acceptable deviation range for each processing step to be monitored, storing the "alarm" range of the acceptable deviation range, receiving the data indicative of the actual measured value for the processing step, analyzing/comparing the received data with the acceptable deviation range, and outputting data to sound an alarm to the technician if the actual measured value if outside of the acceptable deviation range or within a specified alarm range that is within the acceptable deviation range.

The invention described herein allows the user to set the parameter settings in each of the recipe steps differently. This way, the process conditions can be monitored with more specific and well adjusted acceptable deviation range settings in every step. This invention will assist in detecting an abnormal process condition more precisely, which in turn improves the customer's product quality. This method could be used to monitor any other process condition, not simply RF power level. In regards to the RF power related monitoring items, this new monitoring would be useful since the parameter's regular fluctuation level is so variable between a high power step and a low power step. Any equipment supplier who uses an RF generator and monitors the process conditions may find the invention useful.

Figure 2:
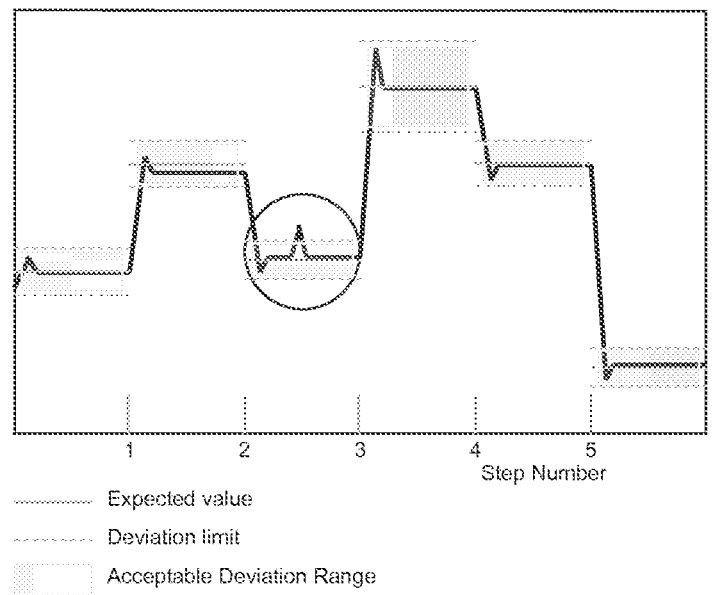
FIG. 2 is a graph showing a process recipe whereby the deviation from the expected value is detected because the acceptable deviation range for each processing step is individually determined so that the acceptable deviation range does not encompass the deviation.

FIG. 2 is a graph showing a process recipe whereby the deviation from the expected value is detected because the acceptable deviation range for each processing step is individually determined so that the acceptable deviation range does not encompass the deviation. FIG. 2 shows the same RF power level applied in all six steps as in FIG. 1. However, the acceptable deviation range for each step is unique and predetermined. In particular, the acceptable deviation range for step three is less than the acceptable deviation range for step four. By defining such acceptable deviation ranges, the RF power level deviation for steps one, two, four, five and six is within the individual, unique acceptable deviation ranges while the acceptable deviation range is exceeded for step three. Thus, the process, when monitored by the conditions exemplified in FIG. 1 will produce an undesirable result due to the undetected, unacceptable deviation. The undesirable result reached due to the undetected and unacceptable deviation will lead to each successive substrate that is processed having a deficiency. Therefore, the results obtained with the process exemplified in FIG. 1 will be an unacceptable product even though throughput may be acceptable.

However, the same process, when monitored by the conditions exemplified in FIG. 2, will alert the technician of the unacceptable deviation for the RF power level. Because the technician is alerted to the unacceptable RF power level for step three, the technician may take corrective measures to ensure that the next substrate that is processed has the desired properties upon completion of the process.

The process shown in FIG. 2 may be executed by software contained in a computer processor. The technician enters the acceptable deviation range for each processing step into the processor. Then, each processing step is monitored during processing with the results of the monitoring sent to the processor. The processor then analyzes or compares the measured values to the acceptable deviation values. If any measured value is outside the range of acceptable values, then the technician is alerted. Additionally, if any measured value is within the "alarm" range of the acceptable deviation range, the technician is alerted. Thus, the substrate throughput may be maximized while maintaining a quality product.

The benefit of the invention discussed herein is that the processing conditions may be monitored for each individual processing step so that acceptable deviation ranges may be chosen for each step rather than on a total process basis. The setting of unique, acceptable deviation ranges permits the technician to produce an acceptable product without compromising substrate throughput. The invention may be used to monitor other conditions in addition to or alternative to RF power levels such as gas concentration, gas flow rate, temperature, and chamber pressure.

The invention may be implemented on using a controller coupled to a semiconductor plasma processing system, such as an etch reactor, chemical vapor deposition chamber, physical vapor deposition chamber and the like. The controller is used to control the various components and processes performed in the vacuum processing system. The controller has a memory, a central processing unit (CPU) and support circuits. The controller is utilized to control the process sequence performed in the chamber, temperature of substrate heaters, temperature of substrate supports, chamber pressure and pump operation, regulating the gas flows from gas sources (when used) and power application from power sources into the chambers. The CPU may be of any form of a general purpose computer processor that can be used in an industrial setting. The software routines can be stored in the memory, such as random access memory, read only memory, floppy or hard disk drive, or other form of digital storage. The support circuits are conventionally coupled to the CPU and may comprise cache, clock circuits, input/output subsystems, power supplies, and the like. The software routines, when executed by the CPU, transform the CPU into a specific purpose computer (controller) that controls the process chambers and monitors process conditions in accordance with the present invention. The software routines may also be stored and/or executed by a second controller that may be located remotely from the semiconductor plasma processing system.

In an exemplary mode of operations, a vacuum process is performed on a substrate in a semiconductor plasma processing system. The vacuum process may be an etch process, a deposition process, or an implantation process among others. During the vacuum process, at least one process condition may be monitored in accordance with the invention. The process condition may be at least one of the quantity, rate or pressure of gas flowing into the processing chamber; substrate temperature; chamber wall temperature; power provided to plasma sources (electrode and/or coils); reflected RF power; power provided to bias electrodes in a substrate support; the quantity, rate or pressure of gas provided for backside substrate cooling; chamber pressure; and pump speed, among others. The controller monitors the process condition to determine if the process condition is within a predefined range, is outside the predefined range but within an acceptable limit, or is outside the acceptable limit. If the monitored process condition is within a predefined range, then no action is taken by the controller. If the monitored process condition is outside the predefined range but within an acceptable limit, the controller generates an alert. The alert may be one or more of an audible signal, a visual signal, or an electronic signal (such as an email, text message, page, phone call and the like). If the monitored process condition is outside the acceptable limit, the controller implements a predefined corrective action. The corrective action may be to adjust a process parameter in response to the monitored process condition being outside the acceptable limit or implementing a shutdown routine, and the like.

While the foregoing is directed to embodiments of the present invention, other and further embodiments of the invention may be devised without departing from the basic scope thereof, and the scope thereof is determined by the claims that follow.

The invention claimed is:

1. A computer implemented method for monitoring process conditions, the method sequentially consisting essentially of:
    selecting a first acceptable deviation range of parameters for processing conditions in a first processing step;
    after selecting a first acceptable deviation range, then selecting a second acceptable deviation range of parameters for the processing conditions in a second processing step separate from the first processing step, wherein the second acceptable deviation range is different than the first acceptable deviation range;
    after selecting a second acceptable deviation range, then receiving into a processor a first set of data indicative of the actual value of the process condition for the first processing step;
    after receiving into the processor the first set of data, then receiving into the processor a second set of data indicative of the actual value of the process condition for the second processing step;
    after receiving into the processor the second set of data, then analyzing the first data set and the second data set with the processor to determine whether the first data set and/or the second data set are outside the respective first acceptable deviation range or the second acceptable deviation range; and
    after analyzing the first data set and the second data set, then indicating the first set of data and/or the second set of data are outside the corresponding first acceptable range or the second acceptable range.

2. The method of claim 1, wherein the process condition is RF power applied to an electrode.

3. The method of claim 1, wherein the process condition is RF power reflected back to the power source.

4. The method of claim 1, wherein the process condition is a gas flow rate to a processing chamber.

5. The method of claim 1, wherein the process condition is substrate temperature.

6. The method of claim 1, wherein the process condition is RF frequency.

7. The method of claim 1, wherein the process condition comprises a plurality of processing conditions.

8. The method of claim 7, wherein one process condition is RF power applied to an electrode.

9. The method of claim 8, wherein a second process condition is RF power reflected back to the power source.

10. The method of claim 9, wherein a third process condition is a gas flow rate to a processing chamber.

11. The method of claim 10, wherein a fourth process condition is substrate temperature.

12. The method of claim 11, wherein a fifth process condition is RF frequency.

13. The method of claim 1, wherein the process conditions occur in a plasma enhanced chemical vapor deposition process.

* * * * *